United States Patent
Chiu (10) Patent No.: US 8,416,547 B2
(45) Date of Patent: Apr. 9, 2013

(54) SHORT CIRCUIT PROTECTION WITH REDUCED OFFSET VOLTAGE

(75) Inventor: Kwok-Fu Chiu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 863 days.

(21) Appl. No.: 11/606,711

(22) Filed: Nov. 29, 2006

(65) Prior Publication Data

US 2008/0123235 A1    May 29, 2008

(51) Int. Cl.
    *H02H 3/00*    (2006.01)
(52) U.S. Cl.
    USPC .................................................. 361/87
(58) Field of Classification Search ............ 361/87
    See application file for complete search history.

(56) References Cited

U.S. PATENT DOCUMENTS

| | | | | |
|---|---|---|---|---|
| 3,796,943 | A | 3/1974 | Nelson et al. | 323/9 |
| 4,023,111 | A * | 5/1977 | Mortensen | 330/283 |
| 4,224,155 | A | 9/1980 | Milne | |
| 4,410,859 | A * | 10/1983 | Kuwahara | 330/298 |
| 4,533,839 | A | 8/1985 | Balakrishnan | 307/270 |
| 4,698,582 | A | 10/1987 | Braun et al. | |
| 4,899,098 | A | 2/1990 | Gariboldi et al. | 323/277 |
| 5,018,041 | A | 5/1991 | Szepesi | 361/18 |
| 5,696,658 | A | 12/1997 | Pietrobon | |
| 5,969,926 | A | 10/1999 | Whittaker | |
| 6,496,052 | B1 | 12/2002 | Chiu | 327/513 |
| 6,624,671 | B2 | 9/2003 | Fotouhi | |
| 6,922,321 | B2 | 7/2005 | Katoh et al. | 361/93.9 |
| 6,977,491 | B1 | 12/2005 | Caldwell et al. | 323/282 |
| 7,224,155 | B2 * | 5/2007 | Bo et al. | 323/312 |
| 2005/0035749 | A1 | 2/2005 | Bo et al. | |

OTHER PUBLICATIONS

IEEE, The Authoritative Dictionary of IEEE Standards Terms, 2000, Standards Information Network IEEE Press, Seven Edition, 124.*
"5A Regulator with thermal gradient controlled current limit" Dobkin, R. Solid-State Circuits Conference, Digest of Technical Papers, 1979 IEEE International vol. XXII, Feb. 1979 pp. 228-229.
"A new current limit circuit for smart discrete devices" Shen, Z.J.; Robb, S.P.; Poer Semiconductor Devices and ICs, 1998. ISPSD 98. Proceedings of the 10th International Symposium on Jun. 3-6, 1998 pp. 355-358.
"Design of current limiting circuit in low dropout linear voltage regulator" Lin Chuan; Feng Quan-yaun; Microwave Conference Proceedings, 2005. APMC 2005. Asia-Pacific Conference Proceedings, vol. 1, Dec. 4-7, 2005 pp. 4 sheets.
"Analysis and Design of Analog Integrated Circuits" Paul R. Gray and Robert G. Meyer, John Wiley and Sons 1984 pp. 346-347.

* cited by examiner

*Primary Examiner* — Rexford Barnie
*Assistant Examiner* — Tien Mai
(74) *Attorney, Agent, or Firm* — Alan A. R. Cooper; Wade J. Brady, III; Frederick J. Telecky, Jr.

(57) ABSTRACT

Described herein is technology for, among other things, short-circuit protection. The technology involves sensing a current that is based on an output current and generating a current sense signal in response. The technology further involves buffering the current sense signal. The technology further involves limiting the output current when it exceeds a threshold value.

2 Claims, 8 Drawing Sheets

Fig. 9

SHORT CIRCUIT PROTECTION WITH REDUCED OFFSET VOLTAGE

BACKGROUND

In many circuits, particularly amplifiers, short-circuit protection is necessary to limit the output drive in order to prevent overheating of the output device when it is short-circuiting or running out of control. Ideally, short-circuit protection should not affect the otherwise normal operation of the circuit or the performance of its parameters. Just before a circuit's short-circuit protection kicks in, it typically causes an offset voltage to be seen at the input.

Figure 1:
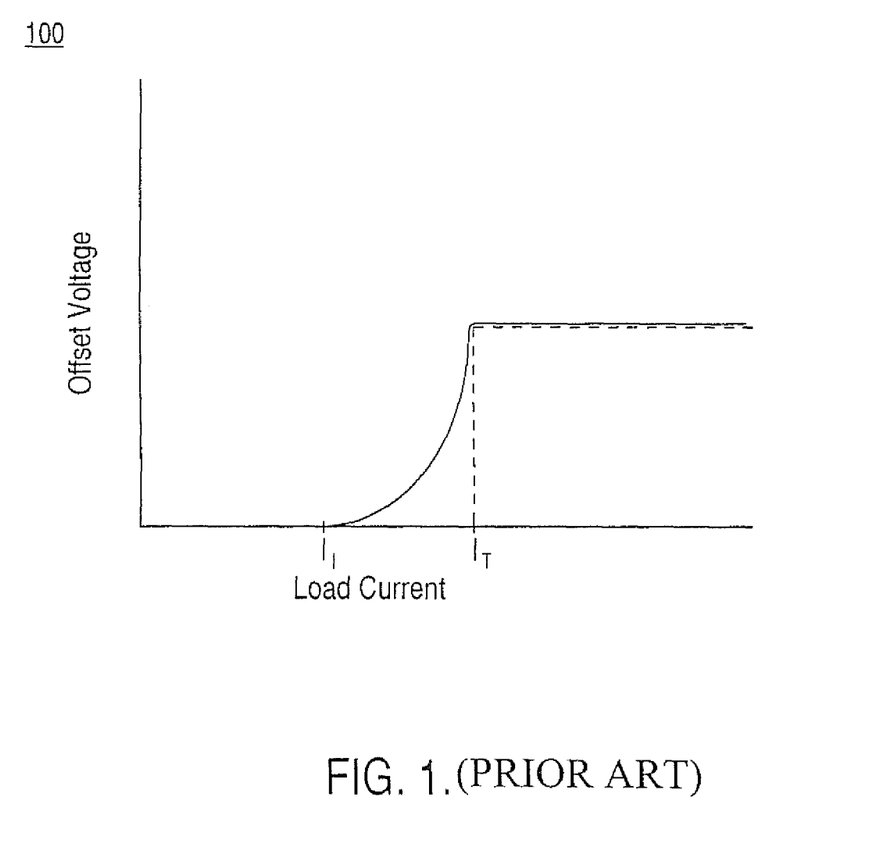
FIG. 1 is a graph illustrating load current versus offset voltage in a conventional circuit employing short-circuit protection and in the ideal case.

FIG. 1 is a graph 100 illustrating load current versus offset voltage in a circuit employing short-circuit protection. The solid line represents the relationship seen in a conventional short-circuit protection circuit. The dashed line represents the ideal case, where no offset is seen until the load current reaches a threshold value ($I_T$). At $I_T$, an ideal protection circuit then turns on sharply, which is seen as an instant change of the offset voltage.

Figure 2:
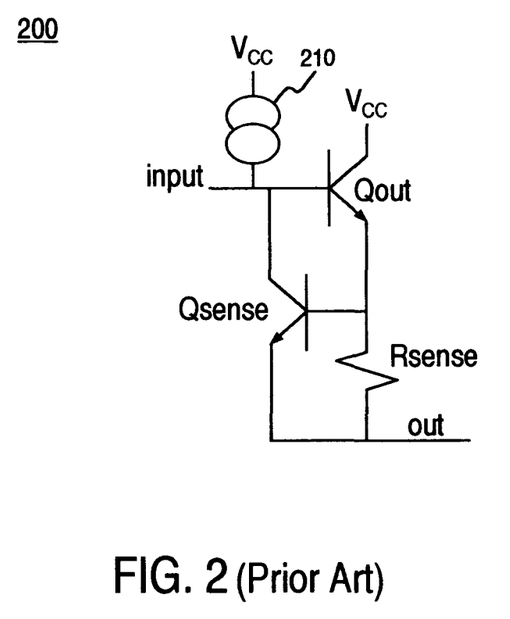
FIG. 2 illustrates a conventional circuit for implementing short-circuit protection.

FIG. 2 illustrates a conventional circuit 200 for implementing short-circuit protection. In circuit 200, $Q_{out}$ drives the output current. As the output current increases, the voltage drop across $R_{sense}$ also increases. When the output current increases to a certain amount ($I_1$, see FIG. 1), the voltage drop across $R_{sense}$ will cause $Q_{sense}$ to start to turn on and steal some of the base current of $Q_{out}$ supplied by the current source 210. However, $Q_{sense}$ turns on gradually rather than sharply (i.e., not a digital on/off). In other words, circuit 200 operates such that $Q_{sense}$ turns on early so that it can be completely turned on at the point where the output current hits the short-circuit threshold value ($I_T$, see FIG. 1). During this intermediate phase between $I_1$ and $I_T$, Qout is still able to supply the required current, but $Q_{sense}$ is already starting to steal some of its base current, and the gradually increasing offset voltage is seen by the input stage (not shown). This effect shown by the solid line in FIG. 1. This type of soft change is undesirable in high precision applications.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Described herein is technology for, among other things, short-circuit protection. The technology involves sensing a current that is based on an output current and generating a current sense signal in response. The technology further involves buffering the current sense signal. The technology further involves limiting the output current when it exceeds a threshold value.

Thus, embodiments provide methods and circuits for short-circuit protection that have reduced offset voltage seen at the input. In contrast to conventional short-circuit protection, which turn on gradually and in some instances prematurely, embodiments of the present invention achieve a sharp activation of the short-circuit protection circuit. This allows an amplifier or the like to maximize the capabilities of its output device, rather than wasting some of its ability due to a gradual activation of a short-circuit protection circuit.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments of the present invention are directed to methods and circuits for creating an abrupt change in offset voltage when a short-circuit protection circuit turns on. Generally speaking, this is achieved by buffering a current sense circuit so that it does not affect to the normal operation of the overall circuit while it is gradually turning on.

Figure 3:
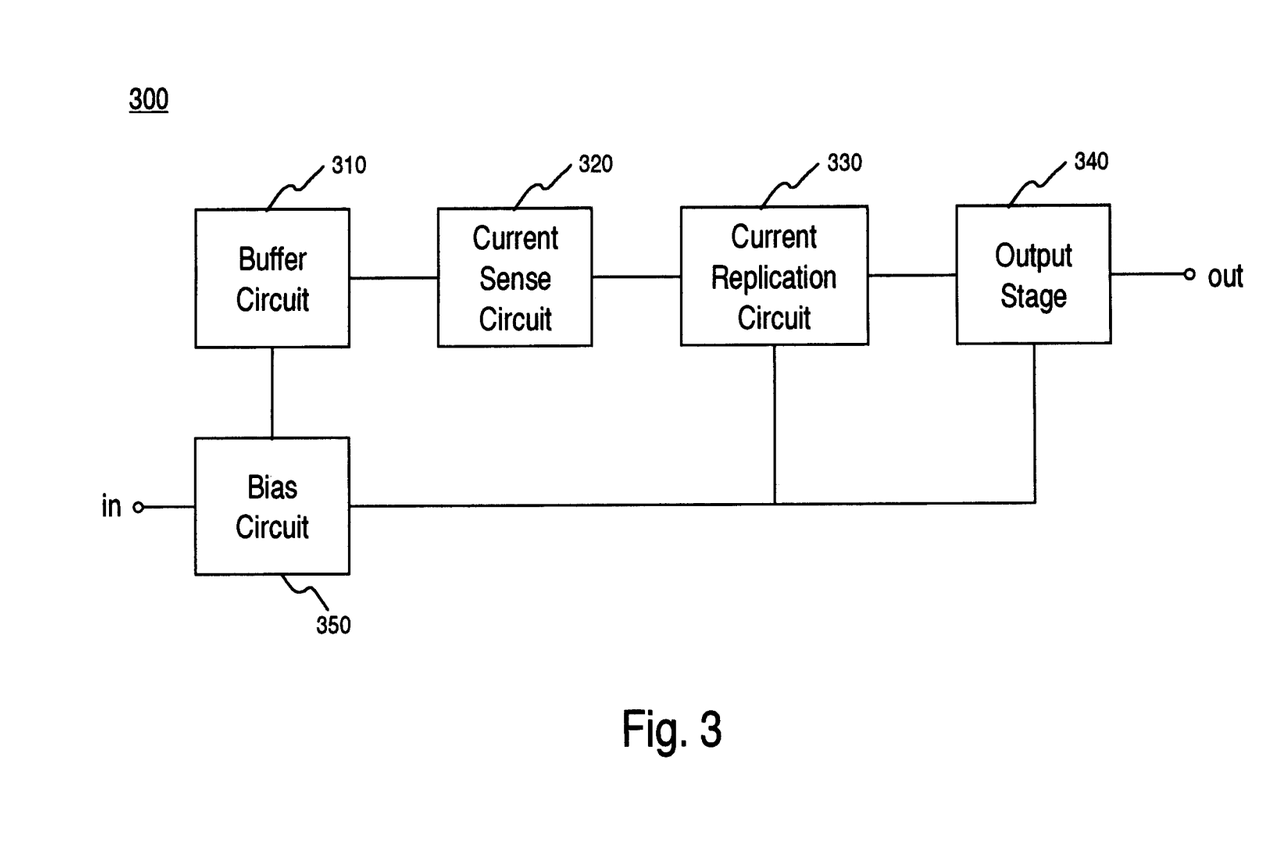
FIG. 3 illustrates a block diagram of a short-circuit protection circuit, in accordance with various embodiments of the present invention.

FIG. 3 illustrates a block diagram of a short-circuit protection circuit 300, in accordance with various embodiments of the present invention. In one embodiment, short-circuit protection circuit 300 forms a part of an amplifier. However, it should be appreciated that embodiments are not limited solely to amplifiers. It is appreciated that amplifiers typically include an input stage (not shown), a short-circuit protection circuit (e.g., short-circuit protection circuit 300), and an output stage (e.g., output stage 340). In one embodiment, short-circuit protection circuit 300 includes an output stage 340 for generating an output current. Short-circuit protection circuit 300 may also include a current sense circuit 320. Current sense circuit 320 is operable to sense the output current either directly or indirectly (e.g., via another current that is proportional to the output current). Current sense circuit 320 is also operable to generate a current sense signal based on the current sensed.

Short-circuit protection circuit 300 also includes a buffer circuit 310 coupled with the current sense circuit 320. Buffer circuit 310 is operable to buffer the current sense signal generated by the current sense circuit 320 and cause the output current to be limited when the output current exceeds a threshold value. This is in contrast to conventional circuits which do not buffer current sense signals and therefore prematurely limit the output current.

In one embodiment, short-circuit protection circuit 300 may also include a current replication circuit 330 coupled between the output stage 340 and the current sense circuit 320. The current replication circuit 330 is operable to generate a current that is proportional to the output current (hereinafter "the proportional current"). In one embodiment, the current replication circuit 330 involves a current mirror. However, it should be appreciated that the current replication circuit 330 may be achieved a number of other ways.

In one embodiment, short-circuit protection circuit 300 may also include a bias circuit 350 coupled with the buffer circuit 310 and the output stage 340. The bias circuit 350 is operable to control the output stage 340 and limit the output current at the output stage based on a control signal received from the buffer circuit 310.

Figure 4:
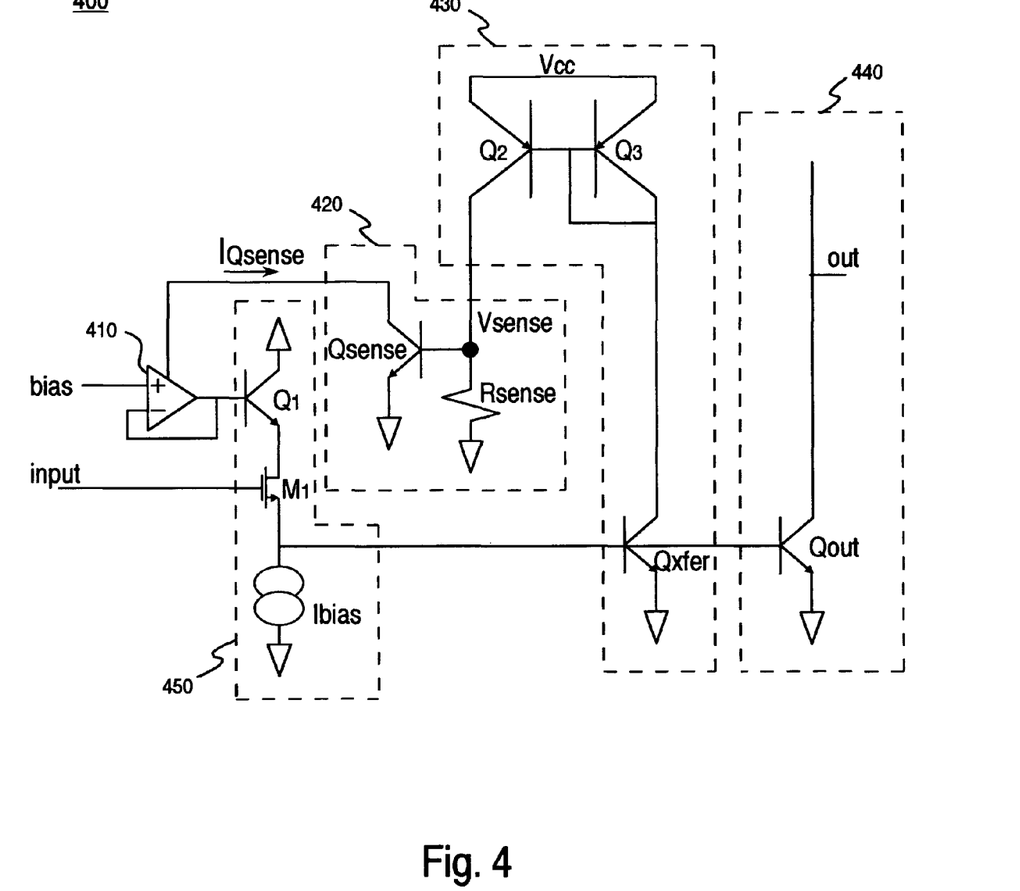
FIG. 4 illustrates an exemplary short-circuit protection circuit, in accordance with various embodiments of the present invention.

FIG. 4 illustrates an exemplary short-circuit protection circuit 400, in accordance with various embodiments of the present invention. Short-circuit protection circuit 400 may include a buffer circuit 410, a current sense circuit 420, a current replication circuit 430, an output stage 440, and a bias circuit 450. Output stage 450 is operable to generate an output current. In one embodiment, output stage 450 includes an output device, such as output transistor $Q_{out}$.

Current replication circuit 430 is operable to generate a replica current that is proportional to the output current. It should be appreciated that current replication circuit 430 may be omitted and the output current may be measured directly. In one embodiment, current replication circuit 430 may include a current mirror (transistors $Q_2$ and $Q_3$). Current replication circuit 430 may also include a sense transfer transistor $Q_{xfer}$ for providing a copy of the output current to the current mirror. Thus, $Q_{xfer}$ provides a copy of the output current to $Q_3$. This current is then mirrored by $Q_2$. It should be appreciated that the current generated by $Q_2$ may be different in magnitude from the output current so long as it remains proportional to the output current.

Current sensing circuit 420 is operable to sense the proportional current and generate a current sense signal ($I_{Qsense}$) based on the proportional current. For example, in one embodiment $Q_2$ provides the proportional current to the current sensing circuit 420. The proportional current is then converted to a voltage ($V_{sense}$) by $R_{sense}$. Thus, as the output current increases, the proportional current through Q2 also increases, which causes $V_{sense}$ to increase. If the output current continues to increase, it will eventually reach a threshold value, which has a corresponding value of $V_{sense}$. $R_{sense}$ is selected such that $V_{sense}$ causes $Q_{sense}$ to become fully operational when the output current is at its threshold value.

As described above, $Q_{sense}$ turns on gradually rather than sharply. In one embodiment, the effect of $Q_{sense}$ turning on gradually is reduced by buffer circuit 410. Buffer circuit 410 is operable to buffer $I_{Qsense}$ generated by $Q_{sense}$ while $Q_{sense}$ is gradually turning on. When $Q_{sense}$ is fully operational, the buffer circuit 410 is configurable to then cause the output current to be limited. In one embodiment, the buffer circuit 410 achieves this by causing a decrease in a bias current delivered to the output stage.

Figure 5:
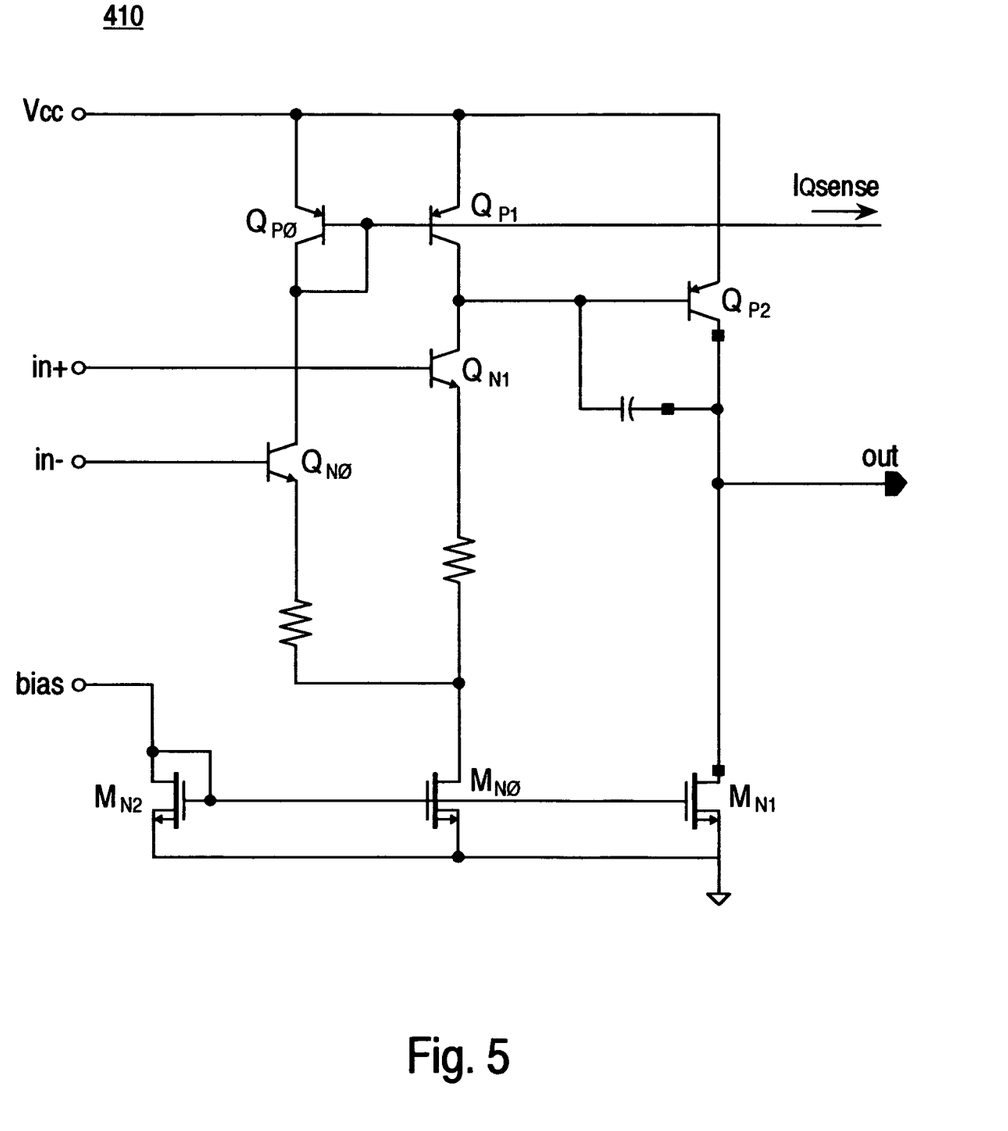
FIG. 5 illustrates an exemplary buffer circuit, in accordance with various embodiments of the present invention.

FIG. 5 illustrates an exemplary buffer circuit 410, in accordance with various embodiments of the present invention. In one embodiment of buffer circuit 410, transistors $M_{N0}$, $M_{N1}$, and $M_{N2}$ provide bias current to the buffer circuit 410. Specifically, $M_{N1}$ mirrors the bias current at $M_{N2}$ for $Q_{P2}$, and $M_{N0}$ mirrors the bias current at $M_{N2}$ for $Q_{P0}$, $Q_{P1}$, $Q_{N0}$, and $Q_{N1}$. During normal operation, $I_{Qsense}$ is zero. However, as described above, as the output current of the short-circuit protection circuit 400 approaches a threshold value, $Q_{sense}$ begins to turn on. When this happens, $Q_{sense}$ begins to "steal" the current $I_{Qsense}$ from the buffer circuit 410. This causes an increase in collector current through $Q_{P0}$ and $Q_{P1}$. Consequently, the voltage at the collectors of $Q_{P1}$ and $Q_{N1}$ increases, which causes a decrease in the base-emitter voltage of $Q_{P2}$, which in turn reduces the collector current through $Q_{P2}$. Since $M_{N1}$ has a fixed current, the reduced collector current at $Q_{P2}$ causes an imbalance in the bias. This imbalance causes the voltage at the output of buffer circuit 410 to decrease. This change in the output voltage of the buffer circuit 410 happens very quickly, as opposed to changes in $V_{sense}$, which occur much more gradually. Thus, the gradual changes of $V_{sense}$ and $I_{Qsense}$ are buffered by buffer circuit 410 such that they are translated into a sharp change in the output of buffer circuit 410.

With reference again to FIG. 4, short-circuit protection circuit 400 may also include a bias circuit 450 for controlling the output stage 440. The bias circuit 450 is also operable to limit the output current based on a control signal (e.g., output voltage) received from the buffer circuit 410. In one embodiment, bias circuit 450 includes a current source $I_{bias}$ for generating a first bias current for the output stage and a first transistor $M_1$ for generating a second bias current for the output stage. By circuit 450 may also include a second transistor $Q_1$ coupled to receive the control signal from the buffer circuit 410. Thus, when the control signal (output) of the buffer circuit 410 decreases, the current through $Q_1$, and thus $M_1$, decreases, which causes a decrease in the base current of $Q_{out}$, thereby limiting the output current.

Figure 6:
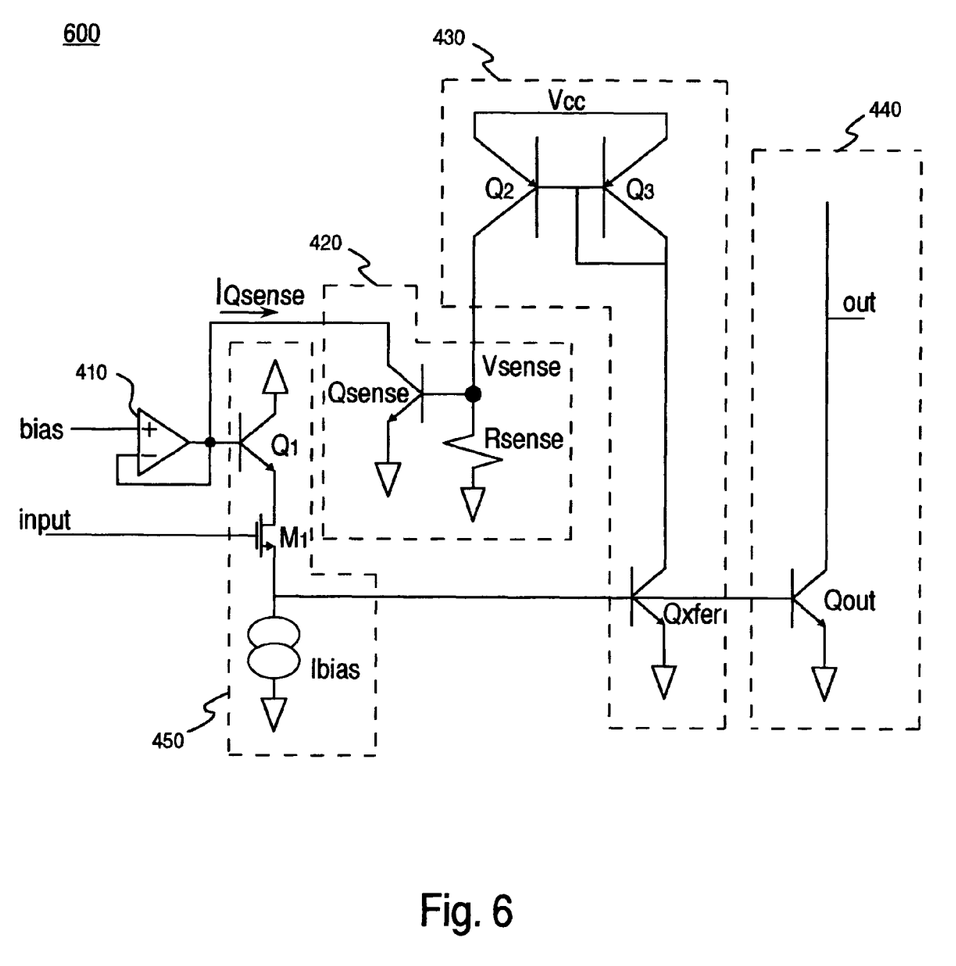
FIG. 6 illustrates an alternative short-circuit protection circuit, in accordance with various embodiments of the present invention.

Modifications may be made to circuit 400 to achieve similar results. For example, FIG. 6 illustrates an alternative short-circuit protection circuit 600, in accordance with various embodiments of the present invention. In short-circuit protection circuit 600, $Q_{sense}$ draws or "steals" $I_{Qsense}$ from the output of buffer circuit 410 in the base of $Q_1$, rather than internally. This in turn causes the current through $Q_1$ to decrease. Moreover, it should be appreciated that short-circuit protection circuit 600 may be achieved without buffer circuit 410 at all. For example, buffer circuit 410 may be removed and the base of $Q_1$ may be connected directly to the bias previously coupled with the noninverting input of the buffer circuit 410.

Figure 7:
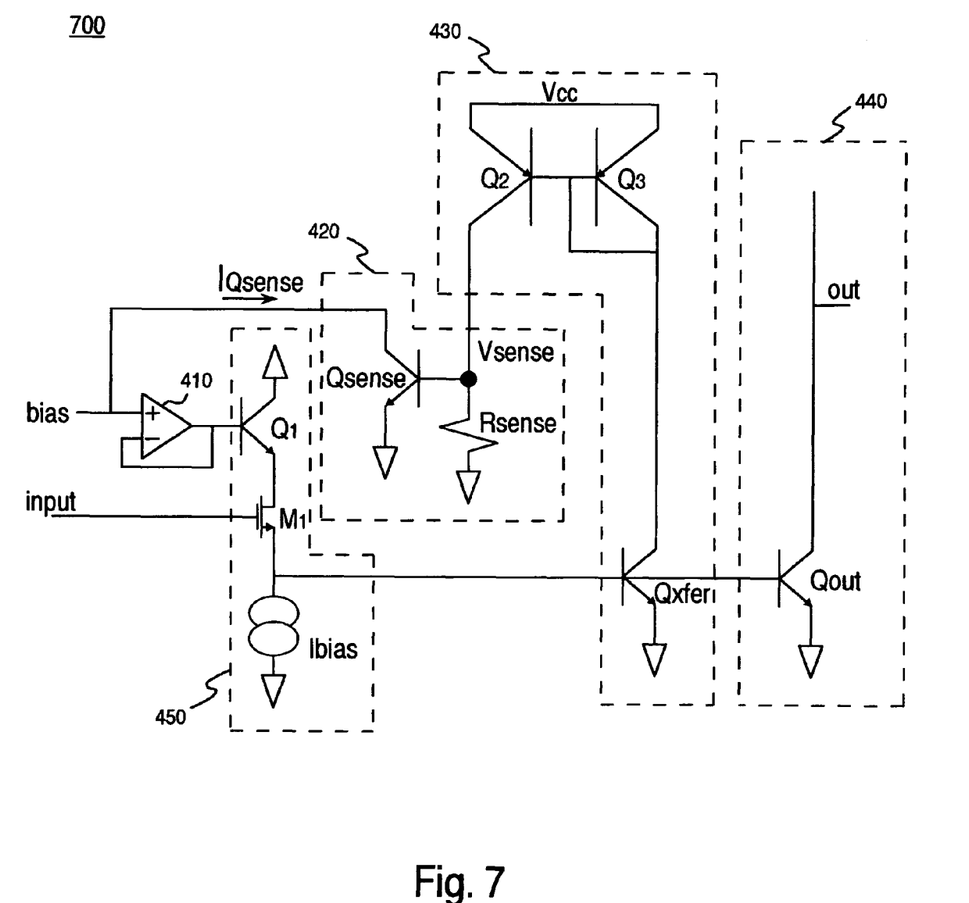
FIG. 7 illustrates another alternative short-circuit protection circuit, in accordance with various embodiments of the present invention.

FIG. 7 illustrates another alternative short-circuit protection circuit 700, in accordance with various embodiments of the present invention. In short-circuit protection circuit 700, $Q_{sense}$ draws or "steals" $I_{Qsense}$ from the bias signal, which is connected to the noninverting input of buffer circuit 410. Thus, when $Q_{sense}$ turns on, it starts to upset the bias of buffer circuit 410, eventually causing its output voltage to decrease.

Figure 8:
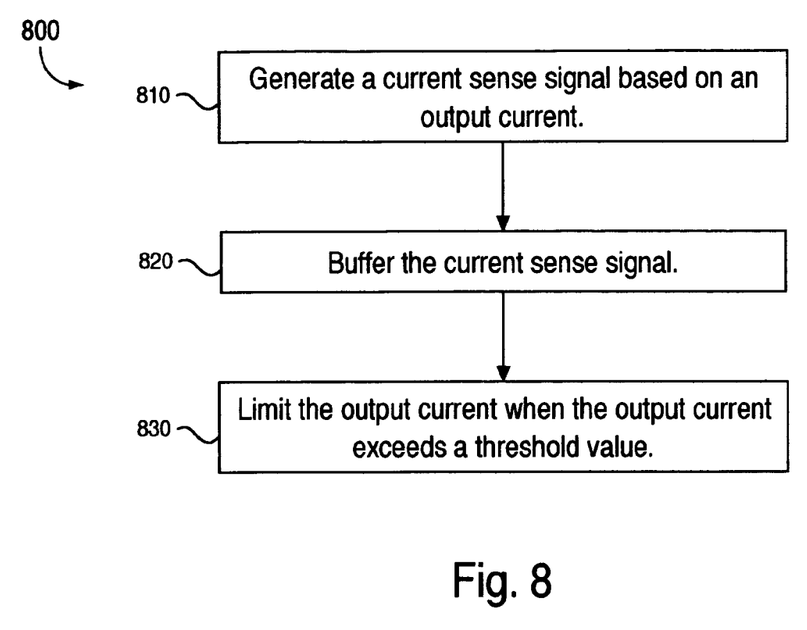
FIG. 8 illustrates a flowchart for reducing offset in a short-circuit protection circuit, in accordance with various embodiments of the present invention.
Figure 9:
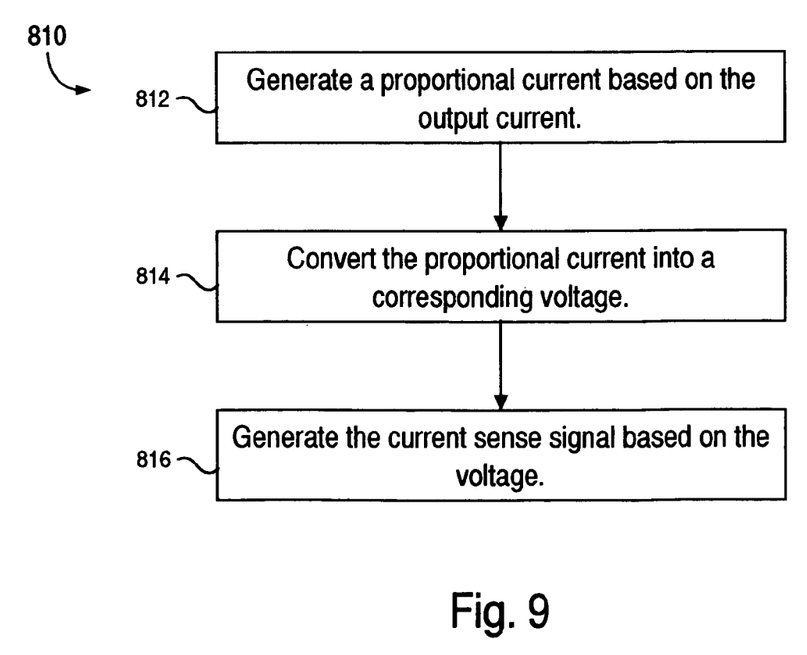
FIG. 9 illustrates a flowchart for generating a current sense signal based on an output current, in accordance with an embodiment of the present invention.

FIG. 8 illustrates a flowchart 800 for reducing offset in a short-circuit protection circuit, in accordance with various embodiments of the present invention. Block 810 involves generating a current sense signal based on an output current. It is appreciated that this may be done in a number of ways. For example, in one embodiment, the output current is measured directly. In another embodiment, the output current is measured indirectly via a proportional current. FIG. 9 illustrates a flowchart 810 for generating a current sense signal based on an output current, in accordance with an embodiment of the present invention. Block 812 involves generating the proportional current based on the output current. This may be achieved, for example, through the use of a current mirror. Block 814 involves converting the proportional current into a corresponding voltage. This may be achieved, for example, by passing the proportional current through a resistive element to produce the corresponding voltage. Block 816 involves generating the current sense signal based on the voltage. This may be achieved, for example, by applying the voltage to an input terminal of a transistor.

With reference again to FIG. 8, block 820 involves buffering the current sense signal. In one embodiment, this is achieved by "stealing" the current sense signal from the buffer circuit. Block 830 involves limiting the output current when the output current exceeds the threshold value. In one embodiment, this is achieved by decreasing in output voltage of the buffer circuit, which thereby causes a corresponding decrease in the output current.

Thus, embodiments provide methods and circuits for short-circuit protection that have reduced offset voltage seen at the input. In contrast to conventional short-circuit protection, which turn on gradually and in some instances prematurely, embodiments of the present invention achieve a sharp activation of the short-circuit protection circuit. This allows an amplifier or the like to maximize the capabilities of its output device, rather than wasting some of its ability due to a gradual activation of a short-circuit protection circuit.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A short-circuit protection circuit configured for use in connection with a circuit that includes an output stage that includes an input and provides an output current, the short-circuit protection circuit operable to limit the output current to a predetermined threshold value, comprising:

an output control circuit responsive to an input signal at said input to control said output current, and in response to a short circuit control signal, to limit said output current to said threshold value, said output control circuit presenting an input offset voltage at said input;

a current sensing circuit for sensing said output current generated by said output stage and generating a current sense signal, wherein said current sense signal (i) turns on when said output current reaches a transition value which, is less than said threshold value and then (ii) increases to a short circuit value when said output current reaches said threshold value;

a buffer circuit coupled with said current sensing circuit and said output control circuit, wherein said buffer circuit is operable with said current sense signal to inhibit a change in the input offset voltage reflected at said input to said output control circuit until said current sense signal reaches said short circuit value indicating that said output current has reached said threshold value, and wherein said buffer circuit is operable to provide such short circuit control signal when said current sense signal reaches said short circuit value indicating that said output current has reached said threshold value, wherein said current sensing circuit, comprises:

a resistive element for converting said output current into a corresponding sense voltage that indicates when said output current reaches said transition value and gradually changes until said output current reaches said transition value; and a sense transistor coupled with said resistive element and said buffer circuit, wherein said sense transistor is operable to generate said current sense signal based on said sense voltage, and a current replication circuit coupled with said output current control circuit, and operable to generate a current replication signal proportional to said output current; and wherein said current sensing circuit is responsive to said current replication signal.

2. The short-circuit protection circuit as recited in claim 1 wherein said buffer circuit comprises an input control transistor coupled to said input, and a buffer amplifier coupled between said current sensing circuit and said input control transistor;

wherein said buffer amplifier buffers said current sense signal as an input to said input control transistor.

* * * * *